(12) United States Patent
Yamamura et al.

(10) Patent No.: US 6,902,090 B2
(45) Date of Patent: Jun. 7, 2005

(54) TAPE FEEDER, ELECTRONIC COMPONENT MOUNTING APPARATUS USING THE SAME, AND METHOD OF FEEDING ELECTRONIC COMPONENTS

(75) Inventors: Tatsuo Yamamura, Fukuoka (JP); Takuya Tsutsumi, Fukuoka (JP); Yoshikazu Higuchi, Fukuoka (JP); Atsuyuki Horie, Fukuoka (JP); Akifumi Wada, Fukuoka (JP); Hiroyuki Sakaguchi, Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 103 days.

(21) Appl. No.: 10/270,321

(22) Filed: Oct. 15, 2002

(65) Prior Publication Data

US 2003/0072644 A1 Apr. 17, 2003

(30) Foreign Application Priority Data

Oct. 16, 2001 (JP) .......................................... 2001-317795
Oct. 16, 2001 (JP) .......................................... 2001-317796

(51) Int. Cl.$^7$ ............................................. B65H 23/18
(52) U.S. Cl. ......................... 226/32; 226/45; 226/133; 414/403
(58) Field of Search ......................... 414/403; 226/122, 226/137, 32, 45, 82, 128, 133

(56) References Cited

U.S. PATENT DOCUMENTS

| | | | | |
|---|---|---|---|---|
| 4,610,083 A | * | 9/1986 | Campisi et al. ............... | 29/832 |
| 4,810,154 A | * | 3/1989 | Klemmer ..................... | 414/222 |
| 5,024,720 A | | 6/1991 | Boss et al. | |
| 5,052,606 A | * | 10/1991 | Cipolla et al. .............. | 226/120 |
| 6,077,022 A | | 6/2000 | Gfeller et al. | |
| 6,157,870 A | | 12/2000 | Gfeller et al. | |
| 6,162,007 A | * | 12/2000 | Witte ......................... | 414/416 |
| 6,550,135 B2 | * | 4/2003 | Nakahara et al. ............ | 29/833 |

FOREIGN PATENT DOCUMENTS

JP 200049495 * 2/2000

* cited by examiner

Primary Examiner—Eileen D. Lillis
Assistant Examiner—Michael Lowe
(74) Attorney, Agent, or Firm—Wenderoth, Lind & Ponack L.L.P.

(57) ABSTRACT

A tape feeder feeds electronic components by advancing a tape intermittently. The tape feeder comprises a motor controller for controlling a motor, which rotatively drives a sprocket to advance the tape, and a communication unit for receiving a control signal from a control unit of an electronic component mounting apparatus and transmitting a control parameter such as a rotating speed, an amount of rotation, and acceleration and deceleration pattern to the motor controller. The tape feeder has such a structure that a tape advancing speed and an amount of tape advancement are easily changeable according to a type of the electronic components by changing the control parameter of the rotating speed and the amount of rotation of the motor. In addition, the tape feeder is adaptable for correction of the amount of rotation according to a result of measurement of pin position of the sprocket, so as to properly interrupt turning of the sprocket at the correct stop position for accurate positioning of the electronic components into the right pick-up location all the time.

10 Claims, 7 Drawing Sheets

FIG. 6A

| Feeder NO. ( ) | | |
|---|---|---|
| Pin NO. | $\Delta x$ | $\Delta y$ |
| 1 | $\Delta x1$ | $\Delta y1$ |
| 2 | $\Delta x2$ | $\Delta y2$ |
| 3 | | |
| ⋮ | | |
| Feeder Offset Data | $\dfrac{\Sigma \Delta x}{n}$ | $\dfrac{\Sigma \Delta y}{n}$ |

FIG. 6B

| Feeder NO. ( ) | |
|---|---|
| Pin NO. | Pin Offset Data |
| 1 | $\Delta x1, \Delta y1$ |
| 2 | $\Delta x2, \Delta y2$ |
| 3 | $\Delta x3, \Delta y3$ |

TAPE FEEDER, ELECTRONIC COMPONENT MOUNTING APPARATUS USING THE SAME, AND METHOD OF FEEDING ELECTRONIC COMPONENTS

FIELD OF THE INVENTION

The present invention relates to a tape feeder for feeding electronic components borne on a tape by advancing them intermittently to a pick-up location in an electronic component mounting apparatus. The invention also relates to a method of advancing the tape.

BACKGROUND OF THE INVENTION

In an electronic component mounting apparatus, a tape feeder is used as a commonly known method of feeding electronic components into a pick-up location of a nozzle of transfer head. In this method, a tape bearing the electronic components is pulled out of a supply reel, and fed to the nozzle by advancing it intermittently in synchronization with mounting timing of the electronic components. This tape feeder intermittently advances the tape only a predetermined amount by rotating a sprocket, which is in engagement with feedholes perforated in the tape.

In using tape feeders, it is a general practice to prepare a number of tape feeders of the same kind, and any of these tape feeders are mounted to a plurality of electronic component mounting apparatuses as needed. In other words, when taking a certain feeder mounting base of the electronic component mounting apparatus as an example, a number of the tape feeders that are adaptable for installation are mounted to it. These tape feeders supply electronic components to the transfer head by advancing the tapes toward a pick-up location.

Because there are various types of electronic components having different sizes, it is necessary to prepare many kinds of tape feeders according to widths of the tapes that bear the electronic components as well as mount pitches of the electronic components along the tapes. However, the conventional tape feeder requires a complicated operation to change a distance of advancement of the sprocket, when the tape requires a different advancing pitch due to a difference in the type of electronic components even if the tape used has the same dimension widthwise. In addition, it is desirable to set an advancing speed and acceleration of the tape appropriately according to the type of electronic components, since there is a risk that the components will move out of their normal positions and result in a failure to stably pick-up the components depending on the type of electronic components and the operation during advancement of the tape. However, it is not possible to make such a setting of the tape advancing speed easily with the conventional tape feeders.

In many of these tape feeders, there are tape advancing errors due to individual instrumental errors, and a position of the advanced tape does not always come into alignment with the pick-up location of the transfer head. Mechanical adjustments are therefore necessary, such as alignment of a positioning dowel for each of the tape feeders in the prior art, and they require a great effort if many tape feeders are involved.

SUMMARY OF THE INVENTION

In an electronic component mounting apparatus, a tape feeder supplies electronic components to a pick-up location by intermittently advancing a tape bearing the electronic components. The tape feeder comprises: a sprocket in engagement with feedholes perforated at regular pitches in the tape, for advancing the tape; a drive mechanism including a motor as a driving force for rotatively driving the sprocket; and a motor controller for controlling the motor. The tape feeder further has any of the following features.

A) The tape feeder is provided with a communication unit for receiving a control signal from an external device.
B) The tape feeder draws data on an amount of rotation of the motor corresponding to a position where turning of the sprocket is interrupted, based on a result of measurement of a pin position of the sprocket.

In a method of feeding electronic components using the tape feeder provided with the above feature "A", the tape feeder changes control parameter of the motor by communicating a control signal between the motor controller for controlling the motor and a control unit in the electronic component mounting apparatus during the step of advancing the tape intermittently by turning the sprocket with the drive mechanism having driving force of the motor.

A method of feeding electronic components using the tape feeder of the above feature "A" comprises measuring a pin position of the sprocket when the sprocket is interrupted from turning, as an electronic component is advanced to a pick-up location. Data on an amount of rotation of the motor corresponding to the position where turning of the sprocket is interrupted is drawn based on a result of measurement of the pin position.

In addition, an electronic component mounting apparatus includes the tape feeder provided with any of the above features "A" and "B".

BRIEF DESCRIPTION OF THE DRAWINGS

FIG. 6A and FIG. 6B are tables respectively showing data on stop position and data on pick-up location of the tape feeder according to the exemplary embodiment of this invention.

DETAILED DESCRIPTION OF THE INVENTION

Figure 1:
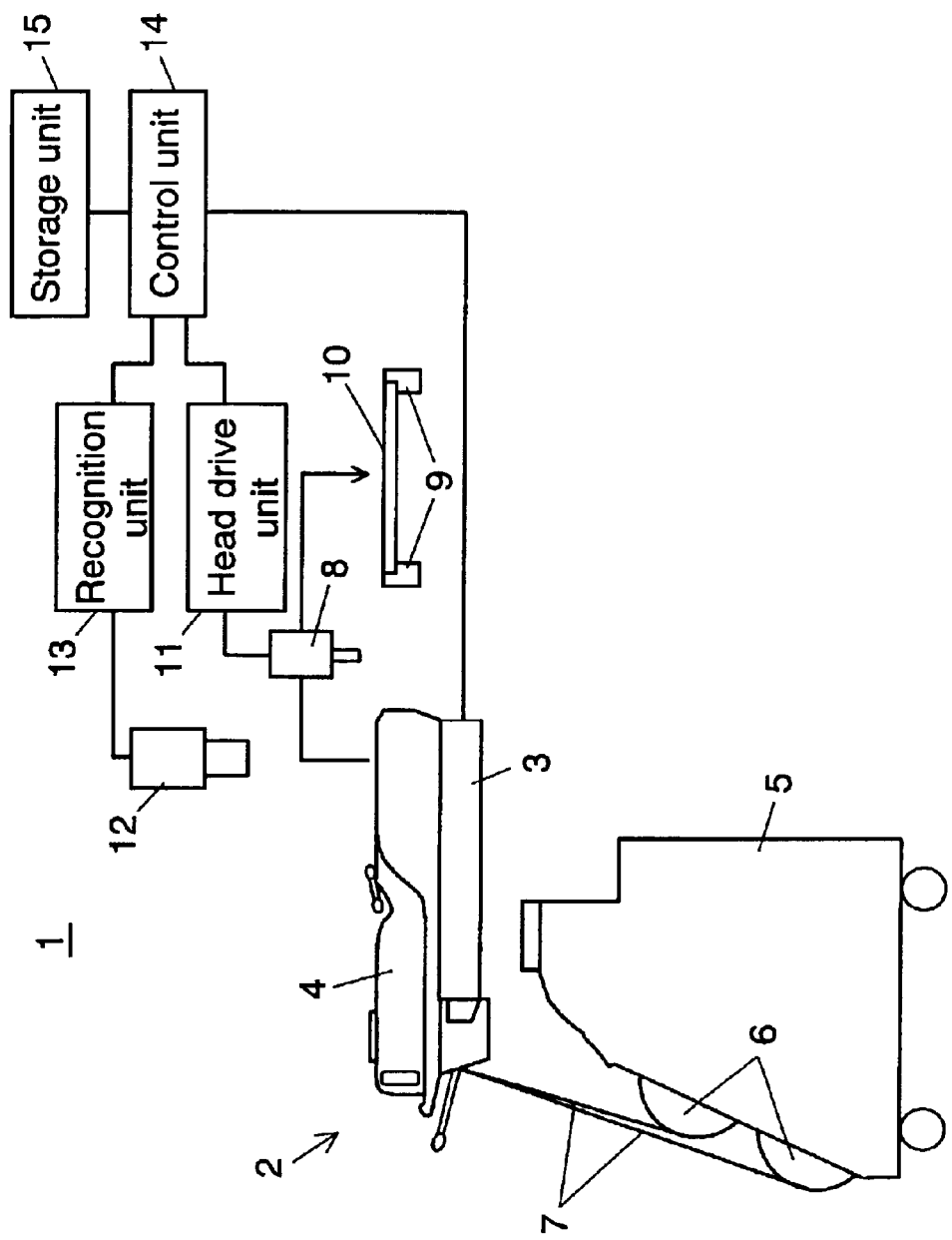
FIG. 1 is a side view depicting an electronic component mounting apparatus provided with a tape feeder according to an exemplary embodiment of the present invention.

First of all, a structure of an electronic component mounting apparatus is described with reference to FIG. 1. In FIG. 1, the electronic component mounting apparatus 1 (hereinafter referred to as "mounting apparatus") comprises component feeder unit 2 for supplying electronic components. The component feeder unit 2 has a plurality of tape feeders 4 mounted to a top surface of feeder base 3. Any of the tape feeders 4 pulls out carrier tape 7 bearing electronic components from supply reel 6 installed on truck 5 placed under the feeder base 3. The tape feeder 4 delivers the electronic components borne thereon to a pick-up location of transfer head 8.

Head drive unit 11 actuates the transfer head 8, which then mounts an electronic component picked up from the tape feeder 4 onto substrate 10 placed on conveyor track 9. Control unit 14 controls the head drive unit 11. Storage unit 15 stores various data necessary for the transfer head 8 to perform mounting operation and the tape feeder 4 to perform advancing operation of the tape.

Figure 3:
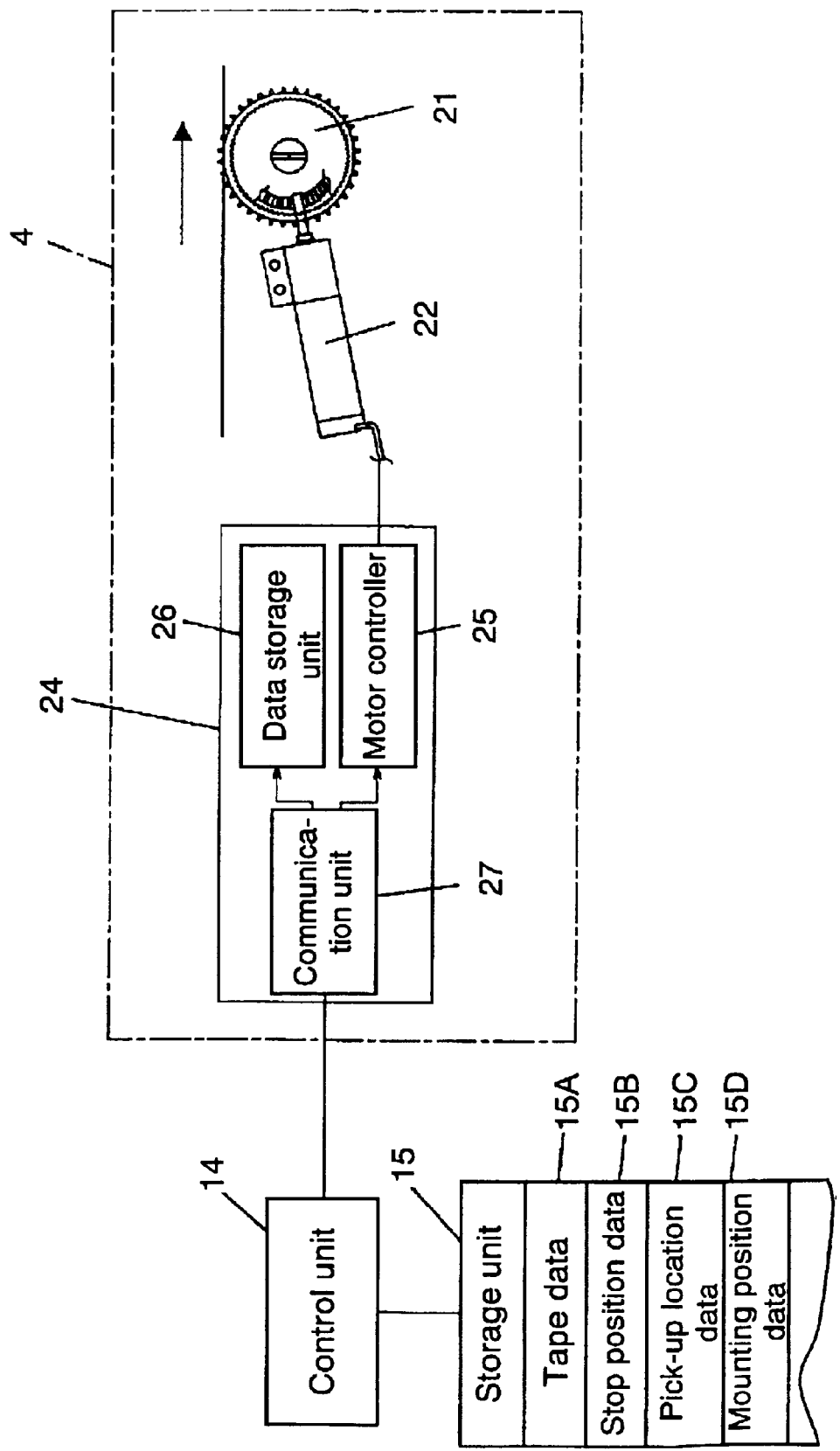
FIG. 3 is a block diagram showing a structure of control system of the tape feeder according to the exemplary embodiment of this invention.

The data include tape data 15A, stop position data 15B, pick-up location data 15C, and mounting position data 15D, as shown in FIG. 3.

The tape data 15A represent such data as an advancing pitch and an advancing speed for intermittent advancement of the carrier tape 7, an acceleration and deceleration pattern during the intermittent advancement, and the like. This data is pre-set individually for each kind of the carrier tapes 7.

The stop position data 15B is correction data used to alleviate deviation or displacement of a stop position of the tape during the intermittent advancement due to instrumental error inherent in each of the tape feeders. The electronic components borne on the carrier tape 7 are precisely aligned with the pick-up location by making a correction with this data. In this exemplary embodiment, this correction is made on deviation of the pin position of the sprocket that forwards the tape in a direction of the tape advancement.

The pick-up location data 15C is data representing a pick-up location of the tape feeder 4 where the transfer head 8 sucks and picks up the electronic components. The pick-up location data is prepared in advance for each of the tape feeders, so as to make a correction of the instrumental error inherent in each of the tape feeders. In this exemplary embodiment, the correction is made due to deviation or displacement in a direction orthogonal to the direction of the tape advancement (among deviations in various directions) of the pin position of the sprocket, by aligning a pick-up location of the transfer head 8.

The mounting position data 15D is data relating to coordinates of a mounting position of the electronic component in the substrate 10.

Camera 12 is installed above the pick-up location of the tape feeder 4. The camera 12 takes a photographic image of the pick-up location and the vicinity thereof, and recognition unit 13 performs a recognition process of the photographic image data. Through this process, the recognition unit 13 discerns a location of a feedhole of the carrier tape 7, a pin position of the sprocket for advancing the tape, and the like, so as to detect an extent of deviation, or displacement, from the regular position. The control unit 14 calculates stop position data and pick-up location data based on the amount of deviation of each of the pin positions as a result of the detection transferred to the control unit 14.

Figure 2:
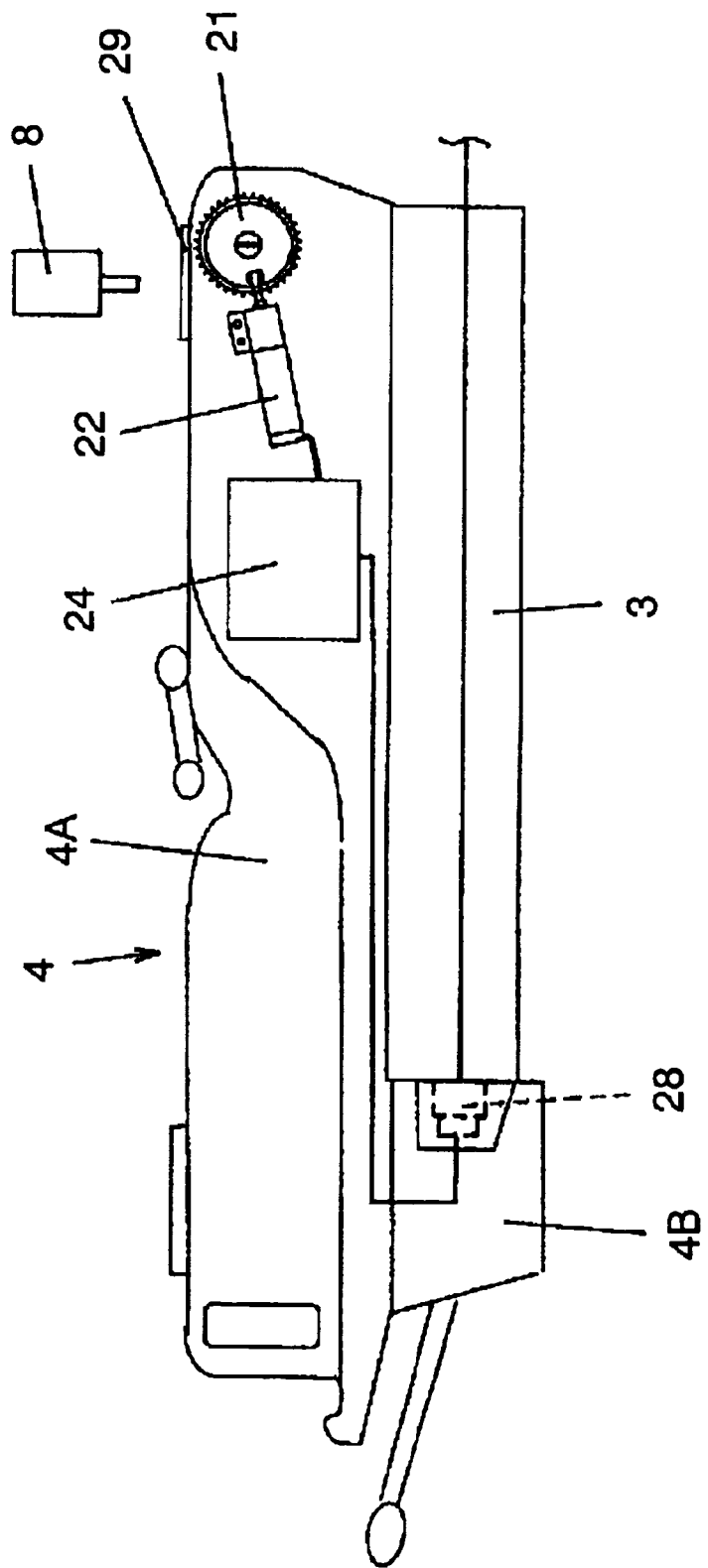
FIG. 2 is a side view depicting the tape feeder according to the exemplary embodiment of this invention.
Figure 4:
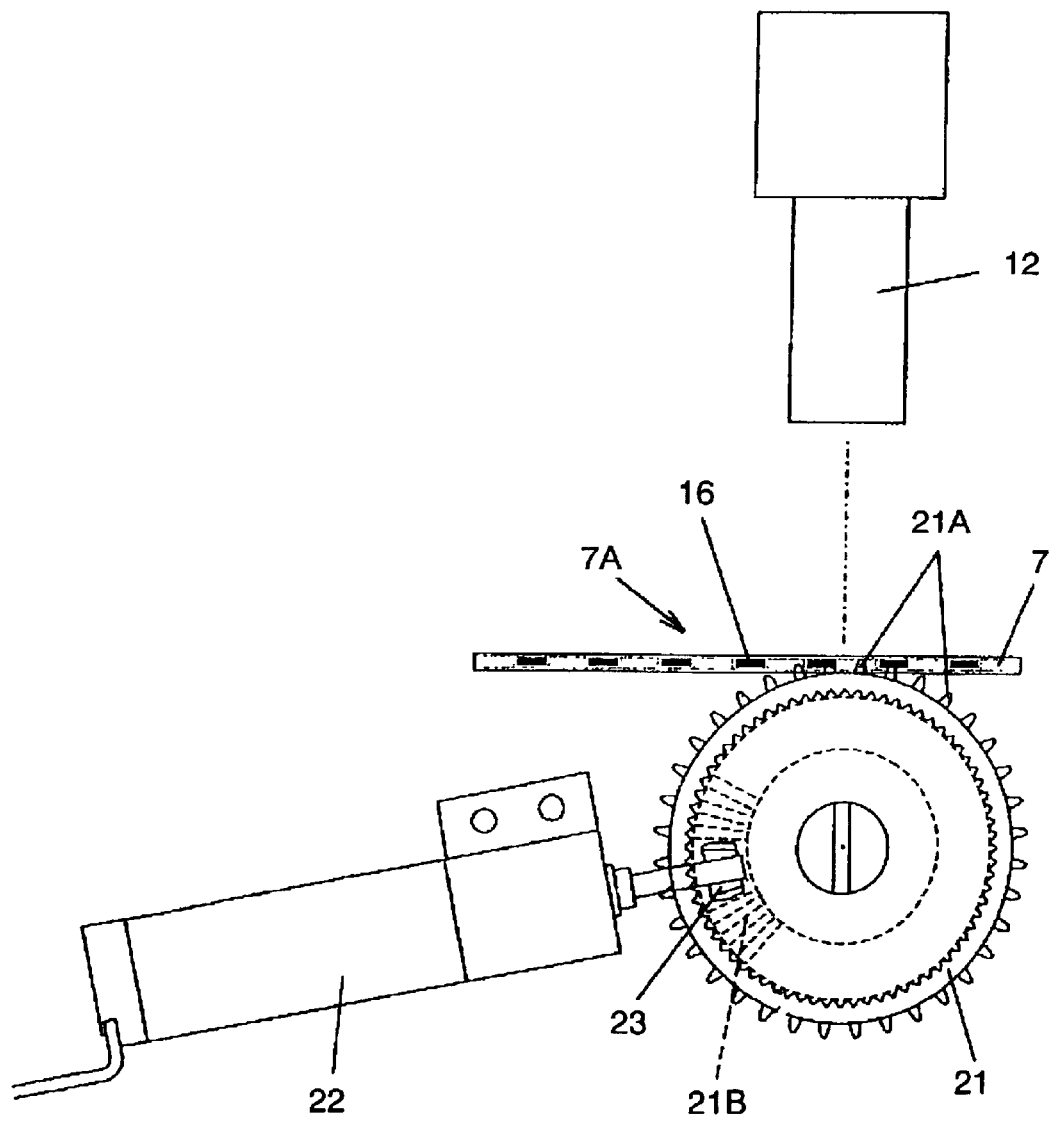
FIG. 4 is a partial side view depicting the tape feeder according to the exemplary embodiment of this invention.

Referring now to FIG. 2, FIG. 3 and FIG. 4, tape feeder 4 will be described next. As shown in FIG. 2, the tape feeder 4 comprises main body 4A having a rectangularly slender shape and fixture unit 4B installed under the main body 4A. The main body 4A is mounted parallel to an upper surface of the feeder base 3, and the fixture unit 4B is positioned securely by engaging it to one end of the feeder base 3. Feeder control unit 24 built into the main body 4A is connected with the control unit 14 of the mounting apparatus 1 through connector 28 provided in the fixture unit 4B. The storage unit 15 transfers data to the feeder control unit 24 via the control unit 14, including data such as the tape data 15A and the stop position data 15B that are necessary for controlling operation of the tape feeder 4.

The tape feeder 4 is provided with sprocket 21 at the forward end. The sprocket 21 has pins 21A at regular pitches around its periphery for engaging feedholes 7B (refer to FIG. 7) provided also at regular pitches along the carrier tape 7 for advancement of the tape. In addition, the sprocket 21 is provided with toothed surface 21 B on its side (refer to FIG. 4) engaging a bevel gear 23 attached to a drive shaft of motor 22. The bevel gear 23 and the toothed surface 21B compose a drive mechanism that drives sprocket 21.

The motor 22, when rotatively driven, turns the sprocket 21, which advances the carrier tape 7. This advancement pulls out the carrier tape 7 from the supply reel 6. The pulled-out carrier tape 7 is guided into the tape feeder 4 from its rear end, and moved forward along a tape-feeding passage.

The motor 22 used in this preferred embodiment is a type that is capable of controlling a rotation speed and an amount of rotation, such as a servomotor. An advancing speed and an advancing pitch for intermittent advancement of the carrier tape, a stop position during the intermittent advancement, and the like can be set freely as desired by controlling the rotation speed and the amount of rotation of the motor 22. The motor 22 is also provided with an encoder with the capability of detecting an absolute position, and it can detect individually a rotational displacement of each of the pins 21A on the sprocket 21.

There is a pick-up location at the forward end of the tape feeder 4, where the transfer head 8 picks up electronic components. The carrier tape 7 guided here is advanced intermittently under cover plate 29 placed on the upper surface of the forward end. The transfer head 8 picks up an electronic component 16 disposed in a recess 7A of the carrier tape 7 through a cutout portion 29A in the cover plate 29 (refer to FIG. 5A) between the intermittent advancements. Prior to picking up of the electronic component 16, a cover tape (not show in these figures) is peeled away from an upper surface of the carrier tape 7, pulled backward, and stored into a storage container (not show in the figures) housed in the main body 4A.

A control system of the tape feeder 4 is constructed as described next with reference to FIG. 3. The tape feeder 4 contains feeder control unit 24. The feeder control unit 24 is provided with motor controller 25, communication unit 27 and data storage unit 26. The motor controller 25 controls motor 22 for driving the sprocket 21. The communication unit 27 receives a control signal from the control unit 14 in the mounting apparatus 1, and transfers to the motor controller 25 such control parameters as a rotation speed, an amount of rotation and the like of the motor 22. Accordingly, the motor controller 25 changes advancing speed, advancing pitch, and so forth of the tape feeder 4 from time to time according to the kind of carrier tape 7 used, as directed by the control unit 14.

In addition, the communication unit 27 performs a process of writing the data sent from the control unit 14 into the data storage unit 26. Therefore, when sending a command regarding control parameters to the motor controller 25, all that is needed is a simple command indicating the kind of carrier tape used, so that the motor controller 25 can change the advancing speed and the advancing pitch, if the data storage unit 26 stores tape data 15A of that particular carrier tape.

According to this exemplary embodiment as described above, a control signal is transmitted from the external device to the motor controller which controls the motor, in the process of turning the sprocket and advancing the tape intermittently by the drive mechanism capable of controlling the rotation speed and amount of rotation using a motor as the driving force. This structure makes it possible to easily change the advancing speed and advancing distance of the tape by changing the control parameters such as the rotating speed and the amount of rotation of the motor according to the electronic components to be mounted. Therefore, the mounting apparatus is flexibly adaptable to the change of a type of electronic components it handles.

The stop position data 15B will be described next. In order to deliver electronic components 16 borne on the carrier tape 7 to the correct position, the pin 21A is required to stop at the proper position during intermittent turning of the sprocket 21. However, there are certain deviations in positions of the individual pins 21A of the sprocket 21 due to manufacturing error. It is therefore necessary to correct the deviations to bring each of the pins 21A to a stop at the right position. In this exemplary embodiment, the necessary correction is made by using camera 12 to discern a position of each of the pins 21A on the sprocket 21, and to obtain an amount of deviation in the position.

Figure 5A:
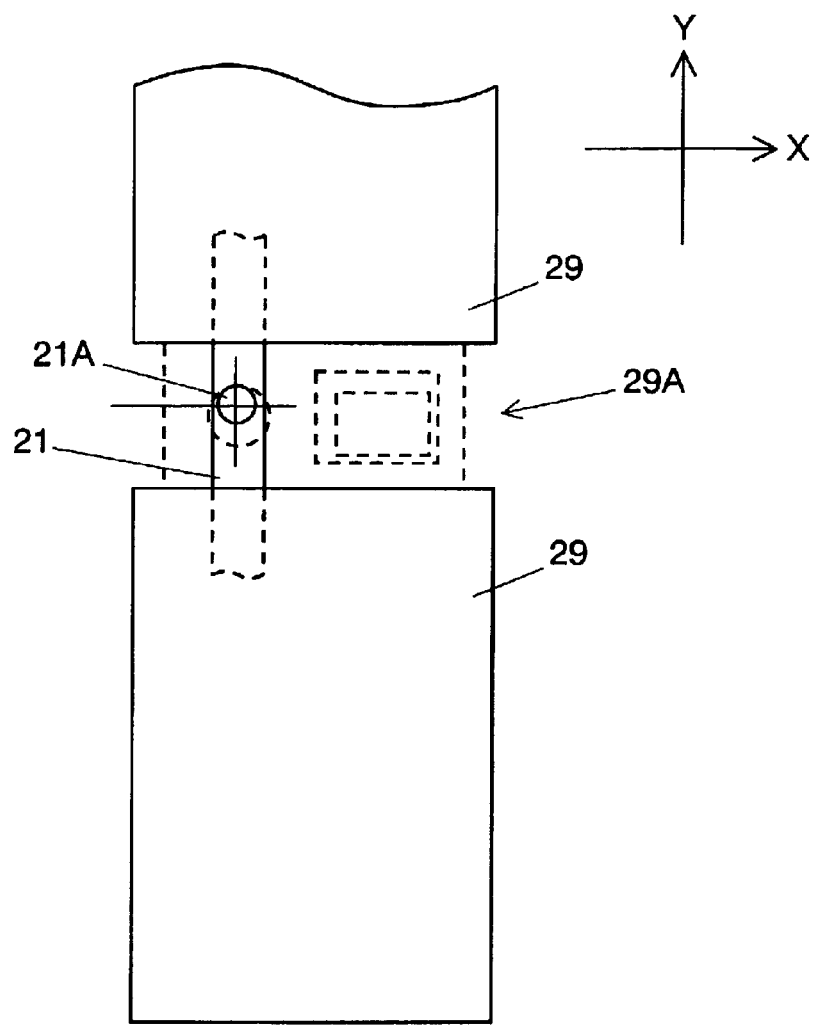
FIG. 5A is a partial plan view depicting the tape feeder according to the exemplary embodiment of this invention.

The deviation in position of each of the pins 21A is measured in a manner as described hereinafter. FIG. 5A shows an upper surface of the cover plate 29 disposed above the sprocket 21. In FIG. 5A, dotted lines illustrate a tape bearing an electronic component in the delivered position. When the camera 12 takes a photographic image of the cutout portion 29A without the carrier tape 7 set in position, it catches an image of one of the pins 21A located at or near a top area of the sprocket 21, and thus a position of this pin 21A is measurable.

Figure 5B:
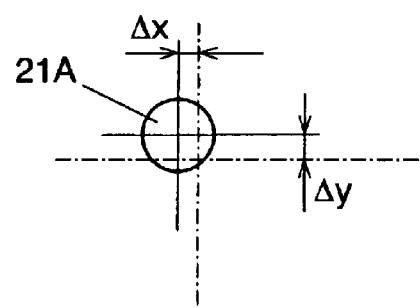
FIG. 5B is an enlarged view of a part of FIG. 5A depicting a pin and the vicinity thereof.

The measurement gives pin offset data $\Delta x$ and $\Delta y$ representing a deviation of the pin 21A in the directions of the X-coordinate and the Y-coordinate, respectively, from the regular position, as shown in FIG. 5B. Offset data indicating a deviation of every one of the pins 21A from the regular position can be obtained in the same manner by measuring the deviation of each pin one after another while turning the sprocket 21 intermittently at intervals of a predetermined pitch. This can thus provide a proper position of each of the pins 21A, that is, a stop position where a turning motion of the sprocket 21 is to be interrupted (stopped) during the intermittent advancement of the tape, when each of the electronic components comes to the correct pickup location. Calculation is now made to obtain data for an amount of rotation of the motor 22 corresponding to each of the stop positions, as stop position data, and this stop position data obtained here is stored as offset data peculiar to the particular tape feeder 4. Accordingly, the motor 22 is controlled and its rotation interrupted based on the offset data, so as to stop the pins 21A at the correct stop position all the time when the tape feeder 4 is under operation.

The control unit 14 performs a process of computing this data in the mounting apparatus 1. Thus, the control unit 14 serves as a stop position datacomputing unit. A result of the computation is stored in the storage unit 15 of the mounting apparatus 1 as the offset data representing amounts of positional deviations. At the same time, these amounts of positional deviations are converted into another form of offset data with a number of pulses representing the amounts of rotation of the motor 22, and are sent to each of the tape feeders 4. The data is hence written into the data storage unit 26 via the communication unit 27 in each of the tape feeders 4. Accordingly, the storage unit 15 of the mounting apparatus 1 and the data storage units 26 of the individual tape feeders 4 serve as stop position data storage units.

With reference to FIG. 5A through FIG. 6B, the feature described next pertains to modes of the stop position data and the pick-up location data. As described here, offset data in the direction of the Y-coordinate corresponds to the stop position data, and offset in the direction of the X-coordinate corresponds to the pick-up location data. In FIG. 6A, measurement is made on positions of all the pins 21A of the sprocket 21 in the tape feeder, for which the data is to be prepared, and the measured pin positions are processed statistically to obtain mean positional data of the pin positions. In other words, mean values $\Sigma\Delta x/n$ and $\Sigma\Delta y/n$ of the offset data $\Delta x$ and $\Delta y$ of the individual pins are obtained, and a mean value of the offset data is used as a single offset data peculiar to this particular tape feeder. Thus, the data processing can be made easily by taking statistical process of the pin positional data and obtaining only one set of offset data peculiar to that tape feeder.

FIG. 6B shows an example in which offset data is stored for each of the pins 21A of the sprocket 21. That is, the offset data $\Delta x$ and $\Delta y$ are stored exactly as they are measured, in the storage unit 15 as the offset data (i.e. stop position data 15B and pick-up location data 15C) peculiar to these particular pins 21A in this example. In the illustrated instance, the stop position data is produced for the individual pins 21A with their deviations reflected as they are. Therefore, these deviations are corrected in order to make the carrier tape 7 stop at the right position at all times even if there are large deviations in the pin positions of the sprocket 21 due to manufacturing error.

What has been discussed in this preferred embodiment is an example which uses distances of deviations of the pins 21A as the stop position data. However, the stop position data can also be obtained by taking a photographic image of an area in the cutoff portion 29A with the carrier tape 7 set in position, and measuring either a position of the recess 7A or a position of the electronic component 16 disposed in the recess 7A. Offset data sets $\Delta x$ and $\Delta y$ obtained in this case are distances of deviations of the electronic component 16 from the regular pick-up location.

Figure 7:
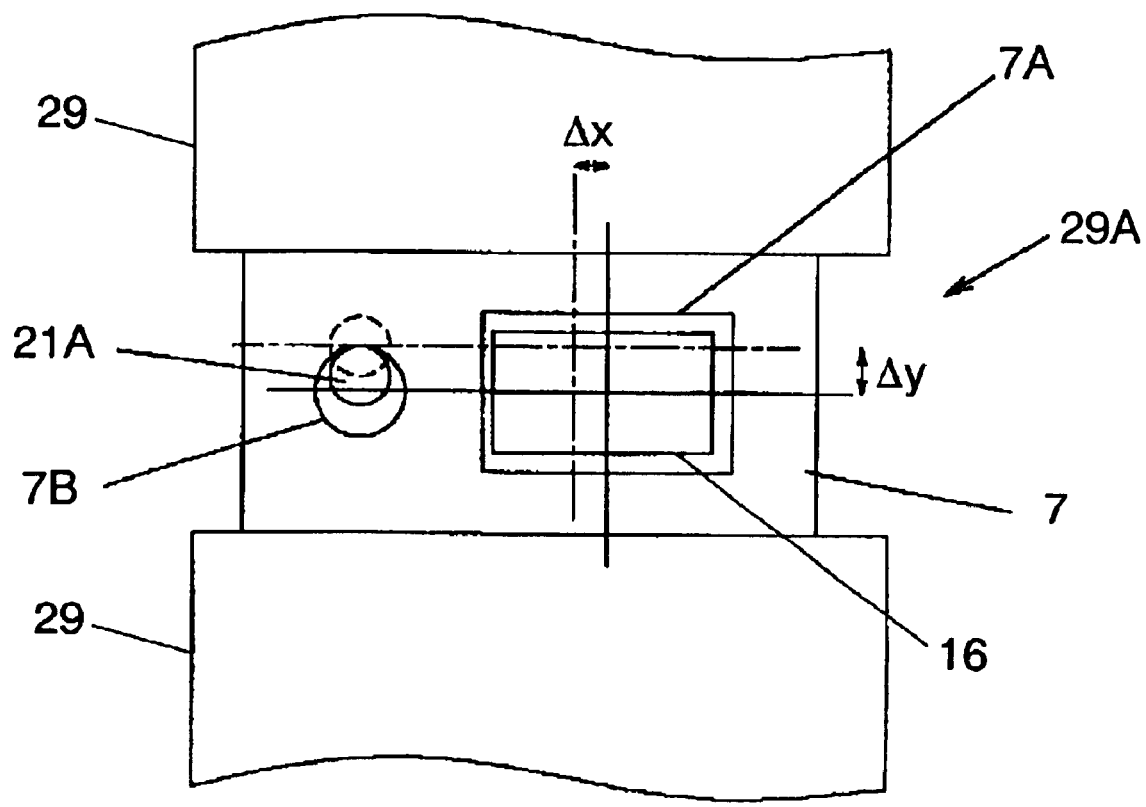
FIG. 7 is expository illustration showing a method of adjusting the stop position and the pick-up location of the tape feeder according to the exemplary embodiment of this invention.

FIG. 7 shows a method of correcting the stop position of the carrier tape 7 based on the stop position data and the pick-up location data, as discussed above, with the tape feeder 4 in operation. To stop the pins 21A of the sprocket 21 at the right position during intermittent advancing, the motor 22 is controlled according to the above-mentioned stop position data for proper positioning. In other words, the motor 22 is stopped at a stop position corresponding to the position where the correction is made only by a distance of the offset data $\Delta y$ in the direction of Y-coordinate from the regular position in the data (shown with a dashed line in the figure), when interrupting rotation of the motor 22.

Following the above process step, the transfer head 8 is activated for a pick-up operation according to the pick-up location data when the electronic component in the recess 7A is picked up with the transfer head 8. That is, the transfer head 8 is lowered after completing the positioning by correcting the position of the transfer head 8 only by a distance of the offset data $\Delta x$ in the direction of X-coordinate from the regular pick-up location in the data. Accordingly, displacement of the pick-up location due to the deviations in the pin positions of the sprocket 21 can be corrected effectively. The invention accomplishes positioning of the electronic component 16 into the correct pickup location, thereby decreasing pick-up errors by the transfer head 8.

According to this preferred embodiment, the tape feeder draws data on an amount of rotation of the motor corresponding to the right position where turning of the sprocket is to be interrupted, based on the result of measurement of pin positions of the sprocket, stores the data as the stop position data, and controls the motor based on the above stop position data when the tape feeder is in operation. This structure allows the sprocket to stop at the right stop position at all times, thereby achieving accurate positioning of the electronic components into the right pick-up location, alleviating difficulties in the positioning of the tape feeder, and improving the work efficiency.

What is claimed is:

1. A tape feeder for feeding an electronic component to a pick-up location in an electronic component mounting apparatus, said tape feeder comprising:

a sprocket for engaging feedholes arranged at regular pitches along a tape, for advancing the tape intermittently;

a drive mechanism having a motor for rotating said sprocket;

a motor controller for controlling said motor; and a data storage unit for storing offset data to control a rotation amount of said motor, said offset data including an actual measured intermittent stopping position of a pin of said sprocket corresponding to a position when the electronic component conveyed by the tape is located at the pick-up location.

2. The tape feeder of claim 1, wherein said sprocket has a plurality of pins, said offset data based on statistically-processed pin positions of all of said pins of said sprocket.

3. The tape feeder of claim 1, wherein said sprocket has a plurality of pins, said offset data including individual pin positions of all of said pins of said sprocket.

4. A method of feeding an electronic component with a tape feeder, said method comprising:

intermittently advancing a tape conveying the electronic component by rotating a sprocket using a motor, the sprocket engaging feedholes arranged at regular pitches along the tape;

measuring an intermittent stopping position of a pin of the sprocket corresponding to a position when the electronic component conveyed by the tape is located at a pick-up location in an electronic component mounting apparatus;

generating offset data based on an amount of rotation of said motor corresponding to the intermittent stopping position of the pin of the sprocket based on the result of said measuring of the intermittent stopping position of the pin of the sprocket;

positioning the electronic component at the pick-up location by controlling the motor to stop the sprocket at the intermittent stopping position based on the offset data; and storing the offset data in a data storage unit.

5. The method of claim 4, wherein the sprocket includes a plurality of pins, said generating of the offset data comprising statistically processing pin measured positions of all of the pins of the sprocket.

6. The method of claim 4, wherein the sprocket includes a plurality of pins, the offset data represents data common to every intermittent stopping position.

7. The method of claim 4, wherein the sprocket includes a plurality of pins, said generating of the offset data comprising generating data individually for all of the plurality of the pins of the sprocket.

8. The method of claim 7, wherein said positioning of the electronic component comprises using the individual data for the pins to position the electronic component.

9. An electronic component mounting apparatus comprising:

a transfer head for transferring an electronic component from a tape conveying the electronic component to a substrate, and for placing the electronic component on the substrate;

a head drive unit including a control unit for controlling movement of said transfer head; and a tape feeder including:
a sprocket for engaging feedholes arranged at regular pitches along a tape, for advancing the tape intermittently;
a drive mechanism having a motor for rotating said sprocket;
a motor controller for controlling said motor; and
a data storage unit for storing offset data to control a rotation amount of said motor, said offset data including an actual measured intermittent stopping position of a pin of said sprocket corresponding to a position when the electronic component conveyed by the tape is located at the pick-up location; and a recognition unit for discerning the intermittent stopping position of said pin of said sprocket.

10. The electronic component mounting apparatus of claim 9, wherein said control unit is operable to correct a location of pick-up location based on the actual measured intermittent stopping position of the pin discerned by said recognition unit.

* * * * *